(12) United States Patent
Maru et al.

(10) Patent No.: US 11,979,115 B2
(45) Date of Patent: May 7, 2024

(54) MODULATOR FEEDFORWARD COMPENSATION

(71) Applicant: Cirrus Logic International Semiconductor Ltd., Edinburgh (GB)

(72) Inventors: Siddharth Maru, Austin, TX (US); Chandra B. Prakash, Austin, TX (US); Tejasvi Das, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 146 days.

(21) Appl. No.: 17/739,480

(22) Filed: May 9, 2022

(65) Prior Publication Data
US 2023/0170854 A1  Jun. 1, 2023

Related U.S. Application Data

(60) Provisional application No. 63/284,030, filed on Nov. 30, 2021.

(51) Int. Cl.
*H03F 3/04* (2006.01)
*B06B 1/02* (2006.01)

(52) U.S. Cl.
CPC ............. *H03F 3/04* (2013.01); *B06B 1/0207* (2013.01); *H03F 2200/129* (2013.01); *H03F 2200/481* (2013.01)

(58) Field of Classification Search
CPC ................. H03F 3/04; H03F 2200/129; H03F 2200/481; H03F 2200/351; H03F 3/2173; H03F 3/45479; B06B 1/0207; B06B 2201/70; B06B 1/023; B06B 1/0253; H04R 3/007; H04R 29/001
(Continued)

(56) References Cited

U.S. PATENT DOCUMENTS 4,888,554 A  12/1989 Hyde et al.
5,286,941 A   2/1994 Bel
(Continued)

FOREIGN PATENT DOCUMENTS

CN   10542884 A    3/2016
CN   106471708 A   3/2017
(Continued)

OTHER PUBLICATIONS

First Office Action, China Intellectual Property Administration, Application No. 202180043659.3, dated Sep. 8, 2023.
(Continued)

*Primary Examiner* — Hieu P Nguyen
(74) *Attorney, Agent, or Firm* — Jackson Walker L.L.P.

(57) ABSTRACT

An amplifier system may include a first feedback loop coupled between an output of an amplifier to an input of a modulator for regulating an output voltage driven at the output of the amplifier to a first terminal of a load of the amplifier system, a sense resistor for sensing a physical quantity associated with the amplifier, a second control loop coupled to the sense resistor such that the sense resistor is outside of the second control loop, the second control loop configured to regulate a common-mode voltage at a second terminal of the load, and a common-mode feedforward circuit coupled to the sense resistor and configured to minimize effects of a signal-dependent common-mode feedback of the sense resistor.

21 Claims, 7 Drawing Sheets

(58) Field of Classification Search
USPC ................. 330/251, 207 A, 10, 282, 109
See application file for complete search history.

(56) References Cited

U.S. PATENT DOCUMENTS

| | | | |
|---|---|---|---|
| 5,361,184 A | 11/1994 | El-Sharkawi et al. |
| 5,567,920 A | 10/1996 | Watanabe et al. |
| 5,661,269 A | 8/1997 | Fukuzaki et al. |
| 5,715,529 A | 2/1998 | Kianush et al. |
| 5,898,136 A | 4/1999 | Katsurahira |
| 6,231,520 B1 | 5/2001 | Maezawa |
| 6,283,859 B1 | 9/2001 | Carlson et al. |
| 6,380,923 B1 | 4/2002 | Fukumoto et al. |
| 6,473,708 B1 | 10/2002 | Watkins et al. |
| 7,173,410 B1 | 2/2007 | Pond |
| 7,965,276 B1 | 6/2011 | Martin et al. |
| 8,144,126 B2 | 3/2012 | Wright |
| 8,174,352 B2 | 5/2012 | Parpia et al. |
| 8,346,487 B2 | 1/2013 | Wright et al. |
| 8,384,378 B2 | 2/2013 | Feldkamp et al. |
| 8,421,446 B2 | 4/2013 | Straubinger et al. |
| 8,428,889 B2 | 4/2013 | Wright |
| 8,457,915 B2 | 6/2013 | White et al. |
| 8,674,950 B2 | 3/2014 | Olson |
| 8,970,230 B2 | 3/2015 | Narayanasamy et al. |
| 9,070,856 B1 | 6/2015 | Rose et al. |
| 9,164,605 B1 | 10/2015 | Pirogov et al. |
| 9,707,502 B1 | 7/2017 | Bonifas et al. |
| 10,128,836 B1 | 11/2018 | Buttolo et al. |
| 10,168,855 B2 | 1/2019 | Baughman et al. |
| 10,372,328 B2 | 8/2019 | Zhai |
| 10,571,307 B2 | 2/2020 | Acker |
| 10,599,247 B2 | 3/2020 | Winokur et al. |
| 10,624,691 B2 | 4/2020 | Wiender et al. |
| 10,642,435 B2 | 5/2020 | Maru et al. |
| 10,725,549 B2 | 7/2020 | Marijanovic et al. |
| 10,726,715 B2 | 7/2020 | Hwang et al. |
| 10,795,518 B2 | 10/2020 | Kuan et al. |
| 10,860,202 B2 | 12/2020 | Sepehr et al. |
| 10,866,677 B2 | 12/2020 | Haraikawa |
| 10,908,200 B2 | 2/2021 | You et al. |
| 10,921,159 B1 | 2/2021 | Das et al. |
| 10,935,620 B2 | 3/2021 | Das et al. |
| 10,942,610 B2 | 3/2021 | Maru et al. |
| 10,948,313 B2 | 3/2021 | Kost et al. |
| 11,079,874 B2 | 8/2021 | Lapointe et al. |
| 11,092,657 B2 | 8/2021 | Maru et al. |
| 11,093,060 B2 | 8/2021 | Yancey et al. |
| 11,204,670 B2 | 12/2021 | Maru et al. |
| 11,294,503 B2 | 4/2022 | Westerman |
| 11,474,135 B2 | 10/2022 | Maru et al. |
| 11,507,199 B2 | 11/2022 | Melanson |
| 11,537,242 B2 | 12/2022 | Das et al. |
| 11,579,030 B2 | 2/2023 | Li et al. |
| 11,644,370 B2 | 5/2023 | Marchais et al. |
| 2001/0045941 A1 | 11/2001 | Rosenberg et al. |
| 2003/0038624 A1 | 2/2003 | Hilliard et al. |
| 2005/0192727 A1 | 9/2005 | Shostak et al. |
| 2005/0258826 A1 | 11/2005 | Kano et al. |
| 2005/0283330 A1 | 12/2005 | Laraia et al. |
| 2006/0025897 A1 | 2/2006 | Shostak et al. |
| 2006/0293864 A1 | 12/2006 | Soss |
| 2007/0047634 A1 | 3/2007 | Kang et al. |
| 2007/0080680 A1 | 4/2007 | Schroeder et al. |
| 2007/0198926 A1 | 8/2007 | Joguet et al. |
| 2007/0268265 A1 | 11/2007 | XiaoPing |
| 2007/0296593 A1 | 12/2007 | Hall et al. |
| 2007/0296709 A1 | 12/2007 | GuangHai |
| 2008/0007534 A1 | 1/2008 | Peng et al. |
| 2008/0024456 A1 | 1/2008 | Peng et al. |
| 2008/0088594 A1 | 4/2008 | Liu et al. |
| 2008/0088595 A1 | 4/2008 | Liu et al. |
| 2008/0142352 A1 | 6/2008 | Wright |
| 2008/0143681 A1 | 6/2008 | XiaoPing |
| 2008/0150905 A1 | 6/2008 | Grivna et al. |
| 2008/0158185 A1 | 7/2008 | Westerman |
| 2009/0008161 A1 | 1/2009 | Jones et al. |
| 2009/0058430 A1 | 3/2009 | Zhu |
| 2009/0140728 A1 | 6/2009 | Rollins et al. |
| 2009/0251216 A1 | 10/2009 | Giotta et al. |
| 2009/0278685 A1 | 11/2009 | Potyrailo et al. |
| 2009/0302868 A1 | 12/2009 | Feucht et al. |
| 2009/0308155 A1 | 12/2009 | Zhang |
| 2010/0019777 A1 | 1/2010 | Balslink |
| 2010/0045360 A1 | 2/2010 | Howard et al. |
| 2010/0114505 A1 | 5/2010 | Wang et al. |
| 2010/0153845 A1 | 6/2010 | Gregorio et al. |
| 2010/0211902 A1 | 8/2010 | Unsworth et al. |
| 2010/0231239 A1 | 9/2010 | Tateishi et al. |
| 2010/0238121 A1 | 9/2010 | Ely |
| 2010/0328249 A1 | 12/2010 | Ningrat et al. |
| 2011/0005090 A1 | 1/2011 | Lee et al. |
| 2011/0214481 A1 | 9/2011 | Kachanov et al. |
| 2011/0216311 A1 | 9/2011 | Kachanov et al. |
| 2011/0267302 A1 | 11/2011 | Fasshauer |
| 2011/0285667 A1 | 11/2011 | Poupyrev et al. |
| 2011/0291821 A1 | 12/2011 | Chung |
| 2011/0301876 A1 | 12/2011 | Yamashita |
| 2012/0050206 A1 | 3/2012 | Welland |
| 2013/0018489 A1 | 1/2013 | Grunthaner et al. |
| 2013/0076374 A1 | 3/2013 | Huang |
| 2013/0106756 A1 | 5/2013 | Kono et al. |
| 2013/0106769 A1 | 5/2013 | Bakken et al. |
| 2013/0269446 A1 | 10/2013 | Fukushima et al. |
| 2014/0002113 A1 | 1/2014 | Schediwy et al. |
| 2014/0028327 A1 | 1/2014 | Potyrailo et al. |
| 2014/0137585 A1 | 5/2014 | Lu et al. |
| 2014/0180042 A1 | 6/2014 | Addison et al. |
| 2014/0225599 A1 | 8/2014 | Hess |
| 2014/0253107 A1 | 9/2014 | Roach et al. |
| 2014/0267065 A1 | 9/2014 | Levesque |
| 2014/0278173 A1 | 9/2014 | Elia et al. |
| 2015/0022174 A1 | 1/2015 | Nikitin |
| 2015/0027139 A1 | 1/2015 | Lin et al. |
| 2015/0077094 A1 | 3/2015 | Baldwin et al. |
| 2015/0084874 A1 | 3/2015 | Cheng et al. |
| 2015/0109243 A1 | 4/2015 | Jun et al. |
| 2015/0293695 A1 | 10/2015 | Schonleben et al. |
| 2015/0329199 A1 | 11/2015 | Golborne et al. |
| 2015/0355043 A1 | 12/2015 | Steeneken et al. |
| 2016/0018940 A1 | 1/2016 | Lo et al. |
| 2016/0048256 A1 | 2/2016 | Day |
| 2016/0117084 A1 | 4/2016 | Ording |
| 2016/0162031 A1 | 6/2016 | Westerman et al. |
| 2016/0169717 A1 | 6/2016 | Zhitomirsky |
| 2016/0179243 A1 | 6/2016 | Schwartz |
| 2016/0231860 A1 | 8/2016 | Elia |
| 2016/0231874 A1 | 8/2016 | Baughman et al. |
| 2016/0241227 A1 | 8/2016 | Hirata |
| 2016/0252403 A1 | 9/2016 | Murakami |
| 2016/0357296 A1 | 12/2016 | Picciotto et al. |
| 2017/0077735 A1 | 3/2017 | Leabman |
| 2017/0093222 A1 | 3/2017 | Joye et al. |
| 2017/0097437 A1 | 4/2017 | Widmer et al. |
| 2017/0140644 A1 | 5/2017 | Hwang et al. |
| 2017/0147068 A1 | 5/2017 | Yamazaki et al. |
| 2017/0168578 A1 | 6/2017 | Tsukamoto et al. |
| 2017/0169674 A1 | 6/2017 | Macours |
| 2017/0184416 A1 | 6/2017 | Kohlenberg et al. |
| 2017/0185173 A1 | 6/2017 | Ito et al. |
| 2017/0187541 A1 | 6/2017 | Sundaresan et al. |
| 2017/0237293 A1 | 8/2017 | Faraone et al. |
| 2017/0242505 A1 | 8/2017 | Vandermeijden et al. |
| 2017/0282715 A1 | 10/2017 | Fung et al. |
| 2017/0315653 A1 | 11/2017 | Vandermeijden et al. |
| 2017/0322643 A1 | 11/2017 | Eguchi |
| 2017/0328740 A1 | 11/2017 | Widmer et al. |
| 2017/0371380 A1 | 12/2017 | Oberhauser et al. |
| 2017/0371381 A1 | 12/2017 | Liu |
| 2017/0371473 A1 | 12/2017 | David et al. |
| 2018/0019722 A1 | 1/2018 | Birkbeck |
| 2018/0020288 A1 | 1/2018 | Risbo et al. |
| 2018/0039331 A1 | 2/2018 | Warren |
| 2018/0055448 A1 | 3/2018 | Karakaya et al. |

(56) References Cited

U.S. PATENT DOCUMENTS

| | | |
|---|---|---|
| 2018/0059793 A1 | 3/2018 | Hajati |
| 2018/0067601 A1 | 3/2018 | Winokur et al. |
| 2018/0088064 A1 | 3/2018 | Potyrailo et al. |
| 2018/0088702 A1 | 3/2018 | Schutzberg et al. |
| 2018/0097475 A1 | 4/2018 | Djahanshahi et al. |
| 2018/0135409 A1 | 5/2018 | Wilson et al. |
| 2018/0182212 A1 | 6/2018 | Li et al. |
| 2018/0183372 A1 | 6/2018 | Li et al. |
| 2018/0189647 A1 | 7/2018 | Calvo et al. |
| 2018/0195881 A1 | 7/2018 | Acker |
| 2018/0221796 A1 | 8/2018 | Bonifas et al. |
| 2018/0229161 A1 | 8/2018 | Maki et al. |
| 2018/0231485 A1 | 8/2018 | Potyrailo et al. |
| 2018/0260049 A1 | 9/2018 | O'Lionaird et al. |
| 2018/0260050 A1 | 9/2018 | Unseld et al. |
| 2018/0294757 A1 | 10/2018 | Feng et al. |
| 2018/0321748 A1 | 11/2018 | Rao et al. |
| 2018/0364731 A1 | 12/2018 | Liu et al. |
| 2019/0052045 A1 | 2/2019 | Metzger et al. |
| 2019/0102031 A1 | 4/2019 | Schutzberg et al. |
| 2019/0179146 A1 | 6/2019 | De Nardi |
| 2019/0197218 A1 | 6/2019 | Schwartz |
| 2019/0204929 A1 | 7/2019 | Attari et al. |
| 2019/0235629 A1 | 8/2019 | Hu et al. |
| 2019/0286263 A1 | 9/2019 | Bagheri et al. |
| 2019/0302161 A1 | 10/2019 | You et al. |
| 2019/0302193 A1 | 10/2019 | Maru et al. |
| 2019/0302890 A1 | 10/2019 | Marijanovic et al. |
| 2019/0302922 A1 | 10/2019 | Das et al. |
| 2019/0302923 A1 | 10/2019 | Maru et al. |
| 2019/0326906 A1 | 10/2019 | Camacho Cardenas et al. |
| 2019/0339313 A1 | 11/2019 | Vandermeijden |
| 2019/0377468 A1 | 12/2019 | Micci et al. |
| 2020/0064952 A1 | 1/2020 | Siemieniec et al. |
| 2020/0064160 A1 | 2/2020 | Maru et al. |
| 2020/0133455 A1 | 4/2020 | Sepehr et al. |
| 2020/0177290 A1 | 6/2020 | Reimer et al. |
| 2020/0191761 A1 | 6/2020 | Potyrailo et al. |
| 2020/0271477 A1 | 8/2020 | Kost et al. |
| 2020/0271706 A1 | 8/2020 | Wardlaw et al. |
| 2020/0271745 A1 | 8/2020 | Das et al. |
| 2020/0272301 A1 | 8/2020 | Duewer et al. |
| 2020/0319237 A1 | 10/2020 | Maru et al. |
| 2020/0320966 A1 | 10/2020 | Clark et al. |
| 2020/0373923 A1 | 11/2020 | Walsh et al. |
| 2020/0382113 A1 | 12/2020 | Beardsworth et al. |
| 2020/0386804 A1 | 12/2020 | Das et al. |
| 2021/0064137 A1 | 3/2021 | Wopat et al. |
| 2021/0140797 A1 | 5/2021 | Kost et al. |
| 2021/0149538 A1 | 5/2021 | Lapointe et al. |
| 2021/0152174 A1 | 5/2021 | Yancey et al. |
| 2021/0361940 A1 | 11/2021 | Yeh et al. |
| 2021/0396610 A1 | 12/2021 | Li et al. |
| 2021/0404901 A1 | 12/2021 | Kost et al. |
| 2022/0029505 A1 | 1/2022 | Khenkin et al. |
| 2022/0075500 A1 | 3/2022 | Chang et al. |
| 2022/0268233 A1 | 8/2022 | Kennedy et al. |
| 2022/0307867 A1 | 9/2022 | Das et al. |
| 2022/0308000 A1 | 9/2022 | Das et al. |
| 2022/0404409 A1 | 12/2022 | Maru et al. |
| 2023/0141666 A1* | 5/2023 | Prakash ............... G06F 3/016 327/100 |
| 2023/0144960 A1* | 5/2023 | Ilango ............... H03F 3/2173 324/650 |

FOREIGN PATENT DOCUMENTS

| | | |
|---|---|---|
| CN | 107076623 A | 8/2017 |
| CN | 209069345 U | 7/2019 |
| CN | 110609610 A | 12/2019 |
| DE | 4004450 A1 | 8/1991 |
| DE | 602004005672 T2 | 12/2007 |
| DE | 102015215330 A1 | 2/2017 |
| DE | 102015215331 A1 | 2/2017 |
| EP | 1697710 B1 | 4/2007 |
| EP | 2682843 A1 | 1/2014 |
| GB | 2394295 A | 4/2004 |
| GB | 2573644 A | 11/2019 |
| GB | 2582065 A | 9/2020 |
| GB | 2582864 A | 10/2020 |
| GB | 2586722 B | 2/2022 |
| JP | 2006246289 A | 9/2006 |
| KR | 20130052059 A | 5/2013 |
| WO | 00/33244 A2 | 6/2000 |
| WO | 20061354832 A2 | 12/2006 |
| WO | 2007068283 A1 | 6/2007 |
| WO | 2016032704 A1 | 3/2016 |
| WO | 2021101722 A1 | 5/2021 |
| WO | 2021101723 A1 | 5/2021 |

OTHER PUBLICATIONS

Combined Search and Examination Report, United Kingdom Intellectual Property Office, Application No. GB2313599.9, dated Oct. 9, 2023.

International Search Report and Written Opinion of the International Searching Authority, International Application No. PCT/US2022/018886, dated Jun. 10, 2022.

Combined Search and Examination Report under Sections 17 and 18(3), UKIPO, Application No. GB2201194.4, dated Jul. 1, 2022.

International Search Report and Written Opinion of the International Searching Authority, International Application No. PCT/US2022/018475, dated Aug. 2, 2022.

First Office Action, China National Intellectual Property Administration, Application No. 202010105829.3, dated Apr. 12, 2022.

Second Office Action, China National Intellectual Property Administration, Application No. 201980022693.5, dated Apr. 13, 2022.

Examination Report under Section 18(3), UKIPO, Application No. GB2015439.9, dated May 10, 2022.

Notice of Preliminary Rejection, Korean Intellectual Property Office, Application No. 10-2020-7029597, dated Jul. 29, 2022.

International Search Report and Written Opinion of the International Searching Authority, International Application No. PCT/US2019/045554, dated Oct. 17, 2019.

Combined Search and Examination Report, UKIPO, Application No. GB1904250.6, dated Sep. 10, 2019.

International Search Report and Written Opinion of the International Searching Authority, International Application No. PCT/US2019/022518, dated May 24, 2019.

International Search Report and Written Opinion of the International Searching Authority, International Application No. PCT/US2019/022578, dated May 27, 2019.

International Search Report and Written Opinion of the International Searching Authority, International Application No. PCT/US2019/021838, dated May 27, 2019.

Combined Search and Examination Report under Sections 17 and 18(3), UKIPO, Application No. GB2001341.3, dated Jun. 29, 2020.

International Search Report and Written Opinion of the International Searching Authority, International Application No. PCT/US2020/059113, dated Feb. 23, 2021.

International Search Report and Written Opinion of the International Searching Authority, International Application No. PCT/US2020/059101, dated Mar. 9, 2021.

First Office Action, China National Intellectual Property Administration, Application No. 201980022689.9, dated Jun. 2, 2021.

First Office Action, China National Intellectual Property Administration, Application No. 201980022693.5, dated Jul. 8, 2021.

International Search Report and Written Opinion of the International Searching Authority, International Application No. PCT/US2021/035695, dated Sep. 9, 2021.

Second Office Action, China National Intellectual Property Administration, Application No. 201980022689.9, dated Oct. 27, 2021.

Second Office Action, China National Intellectual Property Administration, Application No. 201980022693.5, dated Dec. 14, 2021.

Combined Search and Examination Report under Sections 17 and 18(3), UKIPO, Application No. GB2111666.0, dated Feb. 11, 2022.

(56) References Cited

OTHER PUBLICATIONS

Examination Report under Section 18(3), UKIPO, Application No. GB2101804.9, dated Feb. 25, 2022.
International Search Report and Written Opinion of the International Searching Authority, International Application No. PCT/US2022/012721, dated Apr. 26, 2022.
First Office Action, China National Intellectual Property Administration, Application No. 202080080853.4, dated Feb. 22, 2023.
Combined Search and Examination Report under Sections 17 and 18(3), United Kingdom Intellectual Property Office, Application No. GB2215005.6, dated Apr. 11, 2023.
Gao, Shuo, et al., Piezoelectric vs. Capactivie Based Force Sensing in Capacitive Touch Panels, IEEE Access, vol. 4, Jul. 14, 2016.
Second Office Action, China National Intellectual Property Administration, Application No. 201980054799.3, dated May 24, 2023.

\* cited by examiner

MODULATOR FEEDFORWARD COMPENSATION

RELATED APPLICATION

The present disclosure claims priority to U.S. Provisional Patent Application Ser. No. 63/284,030, filed Nov. 30, 2021, which is incorporated by reference herein in its entirety.

FIELD OF DISCLOSURE

The present disclosure relates in general to methods, apparatuses, or implementations for haptic devices and other electromagnetic actuators. Embodiments set forth herein may disclose improvements relating to how a physical quantity, such as an impedance or displacement, of a haptic actuator or other electromechanical load may be sensed.

BACKGROUND

Vibro-haptic transducers, for example linear resonant actuators (LRAs), are widely used in portable devices such as mobile phones to generate vibrational feedback to a user. Vibro-haptic feedback in various forms creates different feelings of touch to a user's skin and may play increasing roles in human-machine interactions for modern devices.

An LRA may be modelled as a mass-spring electromechanical vibration system. When driven with appropriately designed or controlled driving signals, an LRA may generate certain desired forms of vibrations. For example, a sharp and clear-cut vibration pattern on a user's finger may be used to create a sensation that mimics a mechanical button click. This clear-cut vibration may then be used as a virtual switch to replace mechanical buttons.

FIG. 1 illustrates an example of a vibro-haptic system in a device 100. Device 100 may comprise a controller 101 configured to control a signal applied to an amplifier 102. Amplifier 102 may then drive a vibrational actuator (e.g., haptic transducer) 103 based on the signal. Controller 101 may be triggered by a trigger to output the signal. The trigger may, for example, comprise a pressure or force sensor on a screen or virtual button of device 100.

Among the various forms of vibro-haptic feedback, tonal vibrations of sustained duration may play an important role to notify the user of the device of certain predefined events, such as incoming calls or messages, emergency alerts, and timer warnings, etc. In order to generate tonal vibration notifications efficiently, it may be desirable to operate the haptic actuator at its resonance frequency.

The resonance frequency $f_0$ of a haptic transducer may be approximately estimated as:

$$f_0 = \frac{1}{2\pi\sqrt{CM}}$$

where C is the compliance of the spring system, and M is the equivalent moving mass, which may be determined based on both the actual moving part in the haptic transducer and the mass of the portable device holding the haptic transducer.

Due to sample-to-sample variations in individual haptic transducers, mobile device assembly variations, temporal component changes caused by aging, and use conditions such as various different strengths of a user gripping of the device, the vibration resonance of the haptic transducer may vary from time to time.

FIG. 2 illustrates an example of a linear resonant actuator (LRA) modelled as a linear system. LRAs are non-linear components that may behave differently depending on, for example, the voltage levels applied, the operating temperature, and the frequency of operation. However, these components may be modelled as linear components within certain conditions. In this example, the LRA is modelled as a third order system having electrical and mechanical elements. In particular, Re and Le are the DC resistance and coil inductance of the coil-magnet system, respectively; and Bl is the magnetic force factor of the coil. The driving amplifier outputs the voltage waveform V(t) with the output impedance Ro. The terminal voltage $V_T(t)$ may be sensed across the terminals of the haptic transducer. The mass-spring system 201 moves with velocity u(t).

A haptic system may require precise control of movements of the haptic transducer. Such control may rely on the magnetic force factor Bl, which may also be known as the electromagnetic transfer function of the haptic transducer. In an ideal case, magnetic force factor Bl can be given by the product B·l, where B is magnetic flux density and l is a total length of electrical conductor within a magnetic field. Both magnetic flux density B and length l should remain constant in an ideal case with motion occurring along a single axis.

In generating haptic vibration, an LRA may undergo displacement. In order to protect an LRA from damage, such displacement may be limited. Accordingly, accurate measurement of displacement may be crucial in optimizing LRA displacement protection algorithms. Accurate measurement of displacement may also enable increased drive levels of the LRA. While existing approaches measure displacement, such approaches have disadvantages. For example, displacement may be measured using a Hall sensor, but Hall sensors are often costly to implement.

SUMMARY

In accordance with the teachings of the present disclosure, the disadvantages and problems associated with existing approaches for estimating an impedance of and sensing displacement of an electromagnetic transducer may be reduced or eliminated.

In accordance with embodiments of the present disclosure, an amplifier system may include a first feedback loop coupled between an output of an amplifier to an input of a modulator for regulating an output voltage driven at the output of the amplifier to a first terminal of a load of the amplifier system, a sense resistor for sensing a physical quantity associated with the amplifier, a second control loop coupled to the sense resistor such that the sense resistor is outside of the second control loop, the second control loop configured to regulate a common-mode voltage at a second terminal of the load, and a common-mode feedforward circuit coupled to the sense resistor and configured to minimize effects of a signal-dependent common-mode feedback of the sense resistor.

In accordance with these and other embodiments of the present disclosure, a method may include regulating, with a first feedback loop coupled between an output of an amplifier to an input of a modulator, an output voltage driven at the output of the amplifier to a first terminal of a load of the amplifier system. The method may also include sensing, with a sense resistor, a physical quantity associated with the amplifier. The method may additionally include regulating, with a second control loop coupled to the sense resistor such that the sense resistor is outside of the second control loop, a common-mode voltage at a second terminal of the load.

The method may further include minimizing, with a common-mode feedforward circuit coupled to the sense resistor, effects of a signal-dependent common-mode feedback of the sense resistor.

In accordance with these and other embodiments of the present disclosure, a host device may include a load and an amplifier system configured to drive the load. The amplifier system may include a first feedback loop coupled between an output of an amplifier to an input of a modulator for regulating an output voltage driven at the output of the amplifier to a first terminal of a load of the amplifier system, a sense resistor for sensing a physical quantity associated with the amplifier, a second control loop coupled to the sense resistor such that the sense resistor is outside of the second control loop, the second control loop configured to regulate a common-mode voltage at a second terminal of the load, and a common-mode feedforward circuit coupled to the sense resistor and configured to minimize effects of a signal-dependent common-mode feedback of the sense resistor.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
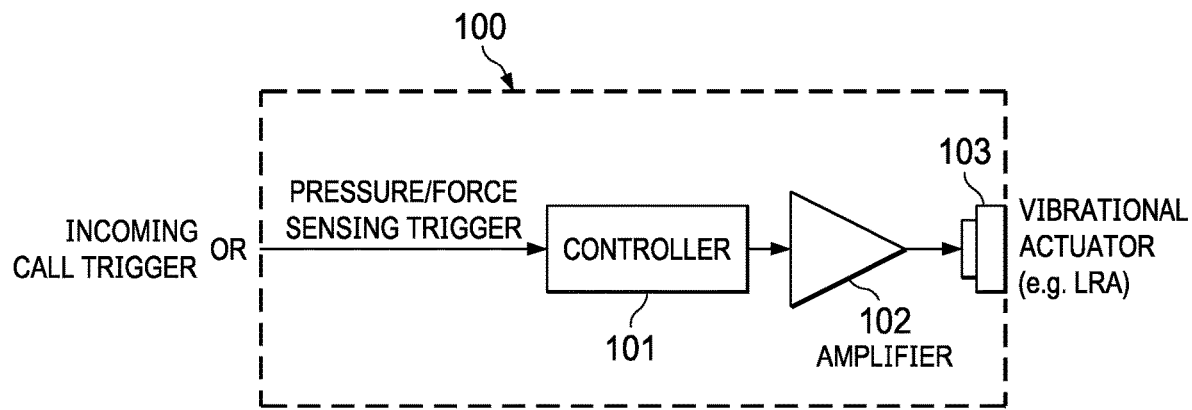
FIG. 1 illustrates an example of a vibro-haptic system in a device, as is known in the art.
Figure 2:
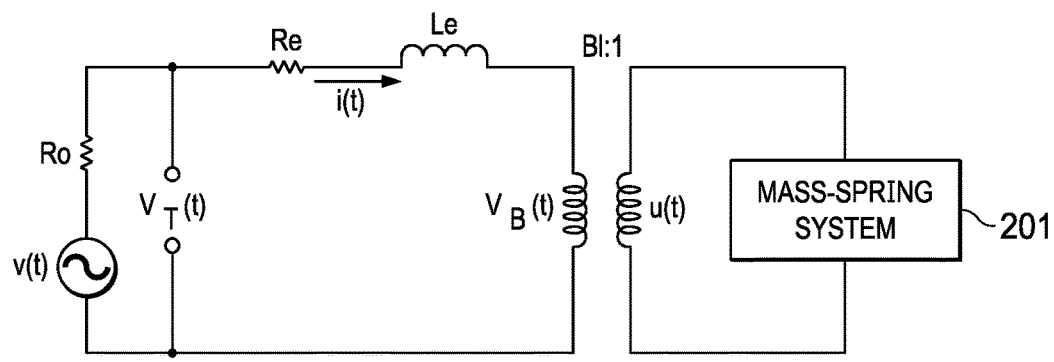
FIG. 2 illustrates an example of a Linear Resonant Actuator (LRA) modelled as a linear system, as is known in the art.

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiment discussed below, and all such equivalents should be deemed as being encompassed by the present disclosure.

Various electronic devices or smart devices may have transducers, speakers, and acoustic output transducers, for example any transducer for converting a suitable electrical driving signal into an acoustic output such as a sonic pressure wave or mechanical vibration. For example, many electronic devices may include one or more speakers or loudspeakers for sound generation, for example, for playback of audio content, voice communications and/or for providing audible notifications.

Such speakers or loudspeakers may comprise an electromagnetic actuator, for example a voice coil motor, which is mechanically coupled to a flexible diaphragm, for example a conventional loudspeaker cone, or which is mechanically coupled to a surface of a device, for example the glass screen of a mobile device. Some electronic devices may also include acoustic output transducers capable of generating ultrasonic waves, for example for use in proximity detection-type applications and/or machine-to-machine communication.

Many electronic devices may additionally or alternatively include more specialized acoustic output transducers, for example, haptic transducers, tailored for generating vibrations for haptic control feedback or notifications to a user. Additionally or alternatively, an electronic device may have a connector, e.g., a socket, for making a removable mating connection with a corresponding connector of an accessory apparatus, and may be arranged to provide a driving signal to the connector so as to drive a transducer, of one or more of the types mentioned above, of the accessory apparatus when connected. Such an electronic device will thus comprise driving circuitry for driving the transducer of the host device or connected accessory with a suitable driving signal. For acoustic or haptic transducers, the driving signal may generally be an analog time varying voltage signal, for example, a time varying waveform.

To accurately sense displacement of an electromagnetic load, methods and systems of the present disclosure may determine an inductance of the electromagnetic load, and then convert the inductance to a position signal, as described in greater detail below. Further, to measure inductance of an electromagnetic load, methods and systems of the present disclosure may utilize either a phase measurement approach and/or a high-frequency pilot-tone driven approach, as also described in greater detail below.

To illustrate, an electromagnetic load may be driven by a driving signal V(t) to generate a sensed terminal voltage $V_T(t)$ across a coil of the electromagnetic load. Sensed terminal voltage $V_T(t)$ may be given by:

$$V_T(t) = Z_{COIL} I(t) + V_B(t)$$

wherein 1(t) is a sensed current through the electromagnetic load, $Z_{COIL}$ is an impedance of the electromagnetic load, and $V_B(t)$ is the back-electromotive force (back-EMF) associated with the electromagnetic load.

As used herein, to "drive" an electromagnetic load means to generate and communicate a driving signal to the electromagnetic load to cause displacement of a movable mass of the electromagnetic load.

Because back-EMF voltage $V_B(t)$ may be proportional to velocity of the moving mass of the electromagnetic load, back-EMF voltage $V_B(t)$ may in turn provide an estimate of such velocity. Thus, velocity of the moving mass may be recovered from sensed terminal voltage $V_T(t)$ and sensed current $I(t)$ provided that either: (a) sensed current $I(t)$ is equal to zero, in which case $V_B(t)=V_T(t)$; or (b) coil impedance $Z_{COIL}$ is known or is accurately estimated.

Position of the moving mass may be related to a coil inductance $L_{COIL}$ of the electromagnetic load. At high frequencies significantly above the bandwidth of the electromagnetic load, back-EMF voltage $V_B(t)$ may become negligible and inductance may dominate the coil impedance $Z_{COIL}$. Sensed terminal voltage $V_{T@HF}(t)$ at high frequencies may be estimated by:

$$V_{T@HF}(t)=Z_{COIL'@HF}(t)$$

Hence, at high frequencies, the position of the moving mass of the electromagnetic load may be recovered from sensed terminal voltage $V_T(t)$ and sensed current $I(t)$ by: (a) estimating the coil impedance at high frequency as $Z_{COIL@HF} R_{@HF}+L_{@HF} \cdot S$, where $R_{@HF}$ is the resistive part of the coil impedance at high frequency, $L_{@HF}$ is the coil inductance at high frequency, and s is the Laplace transform; and (b) converting the measured inductance to a position signal. Velocity and/or position may be used to control vibration of the moving mass of the electromagnetic load.

Figure 3:
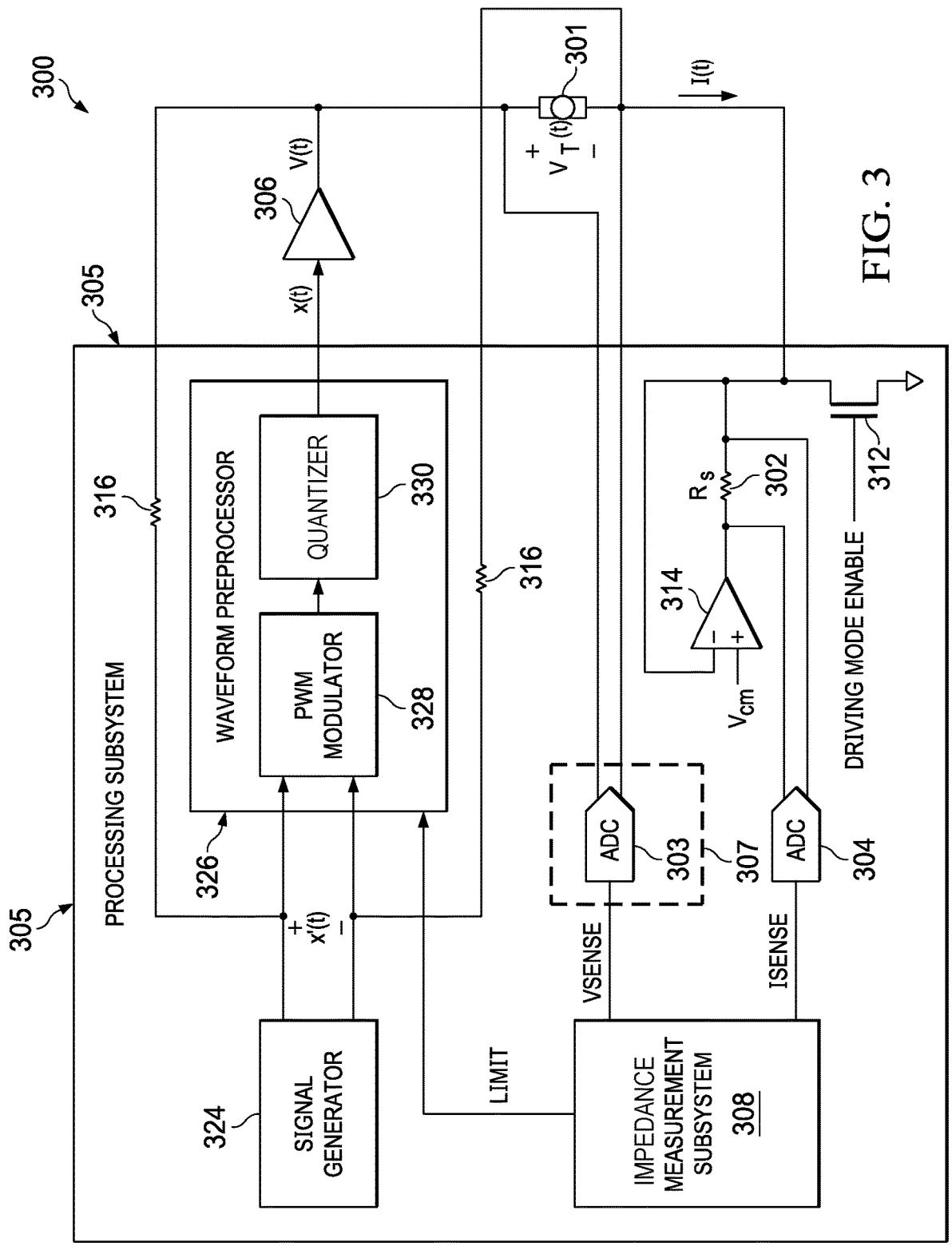
FIG. 3 illustrates selected components of an example host device, in accordance with embodiments of the present disclosure.

FIG. 3 illustrates selected components of an example host device 300 having an electromagnetic load 301, in accordance with embodiments of the present disclosure. Host device 300 may include, without limitation, a mobile device, home application, vehicle, and/or any other system, device, or apparatus that includes a human-machine interface. Electromagnetic load 301 may include any suitable load with a complex impedance, including without limitation a haptic transducer, a loudspeaker, a microspeaker, a piezoelectric transducer, a voice-coil actuator, a solenoid, or other suitable transducer.

In operation, a signal generator 324 of a processing subsystem 305 of host device 300 may generate a raw transducer driving signal x'(t) (which, in some embodiments, may be a waveform signal, such as a haptic waveform signal or audio signal). Raw transducer driving signal x'(t) may be generated based on a desired playback waveform received by signal generator 324. In some embodiments, raw transducer driving signal x'(t) may comprise a differential pulse-width modulated (PWM) signal.

Raw transducer driving signal x'(t) may be received by waveform preprocessor 326 which, as described in greater detail below, may modify or otherwise convert raw transducer driving signal x'(t) in order to generate processed transducer driving signal x(t). For example, waveform preprocessor 326 may include a PWM modulator 328 and a quantizer 330. PWM modulator 328 may include any suitable device, system, or apparatus configured to generate a single-ended PWM signal from raw transducer driving signal x'(t). For example, PWM modulator 328 may include a delta-sigma modulator comprising a loop filter with one or more integrator stages. Quantizer 330 may quantize the intermediate signal generated by PWM modulator 328 to generate an equivalent digital PWM signal referred to herein as processed transducer driving signal x(t). Processed transducer driving signal x(t) may comprise a single-ended signal (e.g., a single-ended PWM signal) communicated to amplifier 306. Processed transducer driving signal x(t) may in turn be amplified by amplifier 306 to generate a driving signal V(t) for driving electromagnetic load 301. Amplifier 306 may comprise a single-ended Class-D output stage (e.g., one half of an H-bridge).

While FIG. 3 depicts use of a PWM modulator 328, any other suitable modulator may be used.

In operation, to estimate impedance $Z_{COIL}$, impedance measurement subsystem 308 may measure impedance in any suitable manner, including without limitation using the approaches set forth in U.S. patent application Ser. No. 17/497,110 filed Oct. 8, 2021, which is incorporated in its entirety by reference herein. For example, processing subsystem 305 may drive a pilot signal to electromagnetic transducer 301, and a complex impedance $Z_{COIL}$ of electromagnetic load 301 may be estimated by measuring the amplitudes of and relative phases between a sensed terminal voltage $V_T(t)$ of electromagnetic load 301 and current $I(t)$ flowing through electromagnetic load 301 that result from driving of the pilot signal (e.g., $$Z_{COIL} = \frac{V_T(t)}{I(t)}$$

From the determination of complex impedance, coil inductance at high frequency $L_{@HF}$ may be estimated, from which a displacement of electromagnetic load 301 may also be estimated.

Accordingly, responsive to driving signal V(t), a sensed terminal voltage $V_T(t)$ of electromagnetic load 301 may be sensed by a terminal voltage sensing block 307 of processing subsystem 305, for example a volt-meter, and converted to a digital representation VSENSE by a first analog-to-digital converter (ADC) 303. As shown in FIG. 3, feedback resistors 316 may be coupled to respective terminals of electromagnetic load 301 and respective input terminals of PWM modulator 328 to provide closed-loop feedback to the generation of processed transducer driving signal x(t).

Similarly, sensed current I(t) may be converted to a digital representation ISENSE by a second ADC 304. Current $1(t)$ may be sensed across a sense resistor 302 having resistance $R_s$ coupled to a terminal of electromagnetic load 301. As shown in FIG. 3, ADC 304 and sense resistor 302 may be part of a current-sensing circuit including a ground-return transistor 312 and a common-mode buffer 314. Ground-return transistor 312 and common-mode buffer 314 may operate in at least two modes: a load sensing mode and a driving mode. During the driving mode (e.g., a normal playback mode or haptics mode), waveform preprocessor 326 may drive a haptic waveform as processed transducer driving signal x(t), ground return transistor 312 may be enabled (e.g., on, closed, activated), and common-mode buffer 314 may be disabled (e.g., off, deactivated), thus coupling a terminal of electromagnetic load 301 to ground. On the other hand, during the load sensing mode, ground return transistor 312 may be disabled and common-mode buffer 314 may be enabled, thus coupling the same terminal of electromagnetic load 301 to a common-mode voltage $V_{CM}$. In the load sensing mode, waveform preprocessor 326 may drive a pilot tone or other signal suitable for measuring driving signal V(t) and sensed current I(t) in order to determine an impedance (e.g., resistance and inductance) of electromagnetic load 301, wherein a component of such impedance (e.g., inductance) may be representative of a displacement of electromagnetic load 301.

As shown in FIG. 3, processing subsystem 305 may include an impedance measurement subsystem 308 that may estimate coil inductance $L_{COIL}$ of electromagnetic load 301. From such estimated coil inductance $L_{COIL}$, impedance measurement subsystem 308 may determine a displacement associated with electromagnetic load 301. If such displacement exceeds a threshold, high-frequency pilot-tone driven impedance measurement subsystem 308 may communicate a limiting signal (indicated by "LIMIT" in FIG. 3) to modify raw transducer driving signal x'(t) in a manner that prevents over-excursion in the displacement of electromagnetic load 301.

Among the advantages of the architecture shown in FIG. 3 is that it may minimize or eliminate direct current flowing through electromagnetic load 301, as the architecture of FIG. 3 uses common-mode buffer 314 to set common-mode voltage $V_{CM}$ on a terminal of electromagnetic load 301 around which the input signal swings. As shown in FIG. 3, sense resistor 302 may be within the closed loop of common-mode buffer 314, and common-mode buffer 314 may have a high bandwidth (e.g., 10 times a Class-D switching frequency for amplifier 306), which may have the effect of "hiding" sense resistor 302 to components outside the closed loop of common-mode buffer 314, promote stability of Class-D circuitry of amplifier 306, and enable low output impedance of common-mode buffer 314 at both signal frequencies and Class-D switching frequencies.

However, such architecture does have disadvantages. For example, the requirements for output impedance, bandwidth, and direct current (DC) gain of common-mode buffer 314 may present design challenges for common-mode buffer 314, potentially requiring a multi-stage transconductance with capacitance feedback compensation-type architecture for common-mode buffer 314. Such disadvantages may be mitigated with an architecture in which sense resistor 302 is outside of the closed loop of common-mode buffer 314, as shown in FIG. 4 described below.

However, an architecture in which sense resistor 302 is outside of the closed loop of common-mode buffer 314 may present its own challenges. To illustrate, during a sensing mode, the pilot signal magnitude used for sensing may be very small in order to minimize power consumption and/or minimize the possibility of the pilot signal causing movement of electromagnetic load 301. Because of the small driving signal, the resistance of the sense resistor 302 must be relatively large (e.g., in the hundreds of ohms) in order to generate a large enough signal for measurement. Unfortunately, this large resistance may cause a large signal-dependent swing across sense resistor 302, which may be fed back into the loop of PWM modulator 328, causing potential instability and overreaction of the PWM modulator loop. Accordingly, as described below, common-mode feedforward circuitry may be used to mitigate or eliminate such potential instability and overreaction.

Figure 4:
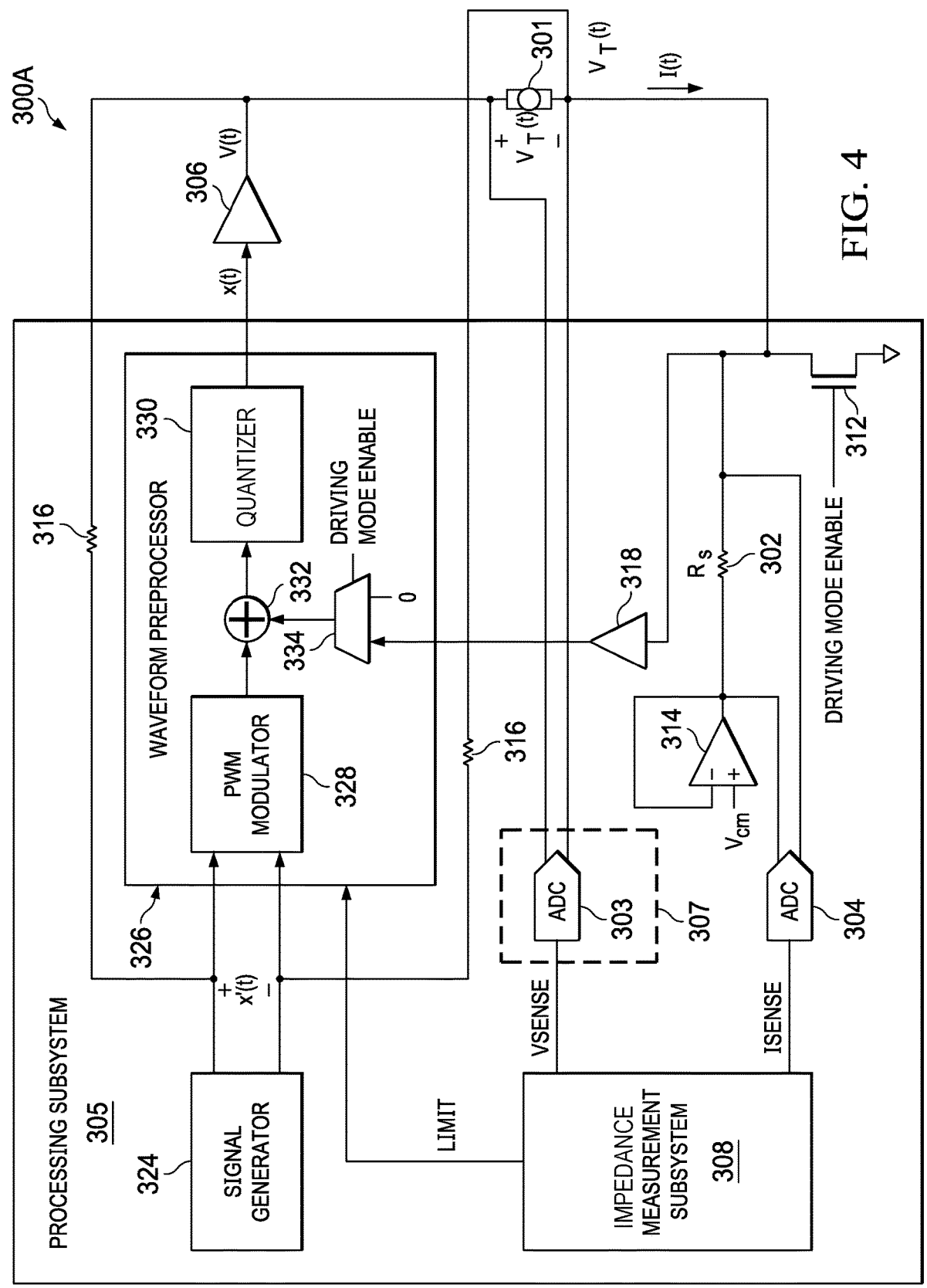
FIG. 4 illustrates selected components of an example host device including common-mode feedforward circuitry, in accordance with embodiments of the present disclosure.

FIG. 4 illustrates selected components of an example host device 300A including common-mode feedforward circuitry, in accordance with embodiments of the present disclosure. Host device 300A depicted in FIG. 4 may be similar in many respects to host device 300 depicted in FIG. 3. Accordingly, only differences between host device 300 and host device 300A may be described below. As shown in FIG. 4, such common-mode feedforward circuitry may include a feedforward buffer 318, a multiplexer 334, and a combiner 332. Further, as also shown in FIG. 4, the feedback loop of common-mode buffer 314 may be closed such that sense resistor 302 is outside the feedback loop of common-mode buffer 314.

During the load sensing mode, feedforward buffer 318 may buffer the voltage $V_7(t)$ present on the "bottom" terminal of electromagnetic load 301, and multiplexer 334 may pass such buffered voltage to combiner 332, where combiner 332 may combine the buffered voltage with the output of PWM modulator 328 and pass such combined signal to quantizer 330. Feeding the buffered signal forward to the output of PWM modulator 328 may avoid latency introduced by integrators internal to PWM modulator 328, while also potentially minimizing overreaction of such integrators to a large signal-dependent voltage swing that may be present at the load terminal due to sense resistor 302. In the driving mode, multiplexer 334 may effectively pass a zero signal to combiner 332, thus essentially bypassing the feedforward circuit path.

The architecture of FIG. 4 may also provide the same stabilization effects as the architecture of FIG. 3, but without the design complexity required of common-mode buffer 314 as used in the architecture of FIG. 3. In addition, the feedforward signal fed to the output of PWM modulator 328 may ensure that the output of amplifier 306 and the output of common-mode buffer 314 both ramp at the same rate, minimizing or eliminating any shoot-through current.

Figure 5:
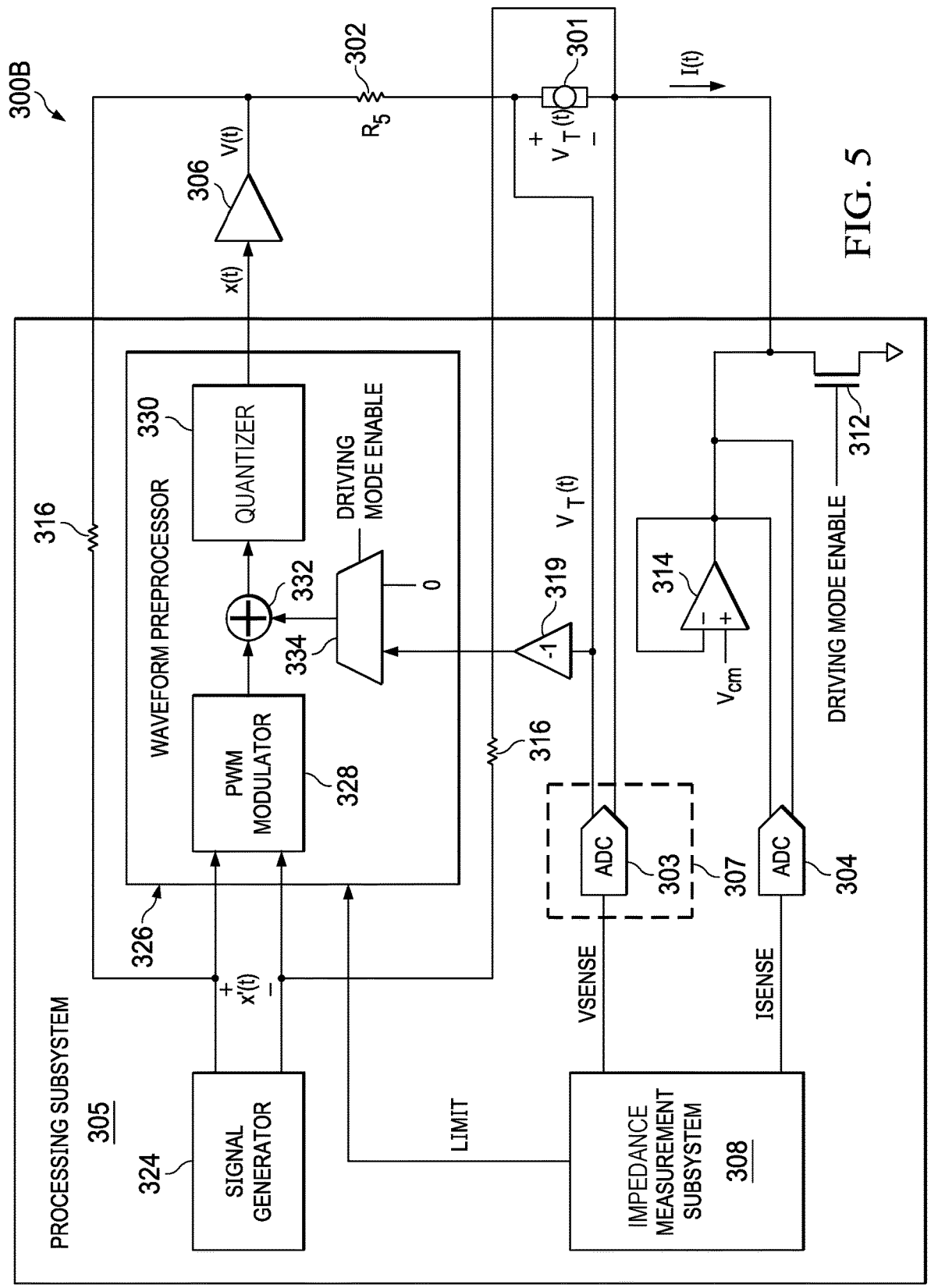
FIG. 5 illustrates selected components of another example host device including common-mode feedforward circuitry, in accordance with embodiments of the present disclosure.

FIG. 5 illustrates selected components of an example host device 300B including common-mode feedforward circuitry, in accordance with embodiments of the present disclosure. Host device 300B depicted in FIG. 5 may be similar in many respects to host device 300A depicted in FIG. 4. Accordingly, only differences between host device 300A and host device 300B may be described below. As shown in FIG. 5, such common-mode feedforward circuitry may include a feedforward buffer 319, a multiplexer 334, and a combiner 332. Feedforward buffer 319 may be similar to feedforward buffer 318 of FIG. 4, except that feedforward buffer 319 may have a negative unity gain, as opposed to the positive unity gain of feedforward buffer 318. Further, as also shown in FIG. 5, rather than being coupled between transducer load 301 and common-mode buffer 314 as in FIG. 4, sense resistor 302 may be coupled between the output of amplifier 306 and transducer load 301 (e.g., the opposite terminal of transducer load 301 as compared to FIG. 4). Accordingly, in all practical respects, the architecture shown in FIG. 5 may be functionally equivalent to that of the architecture of FIG. 4.

Figure 6:
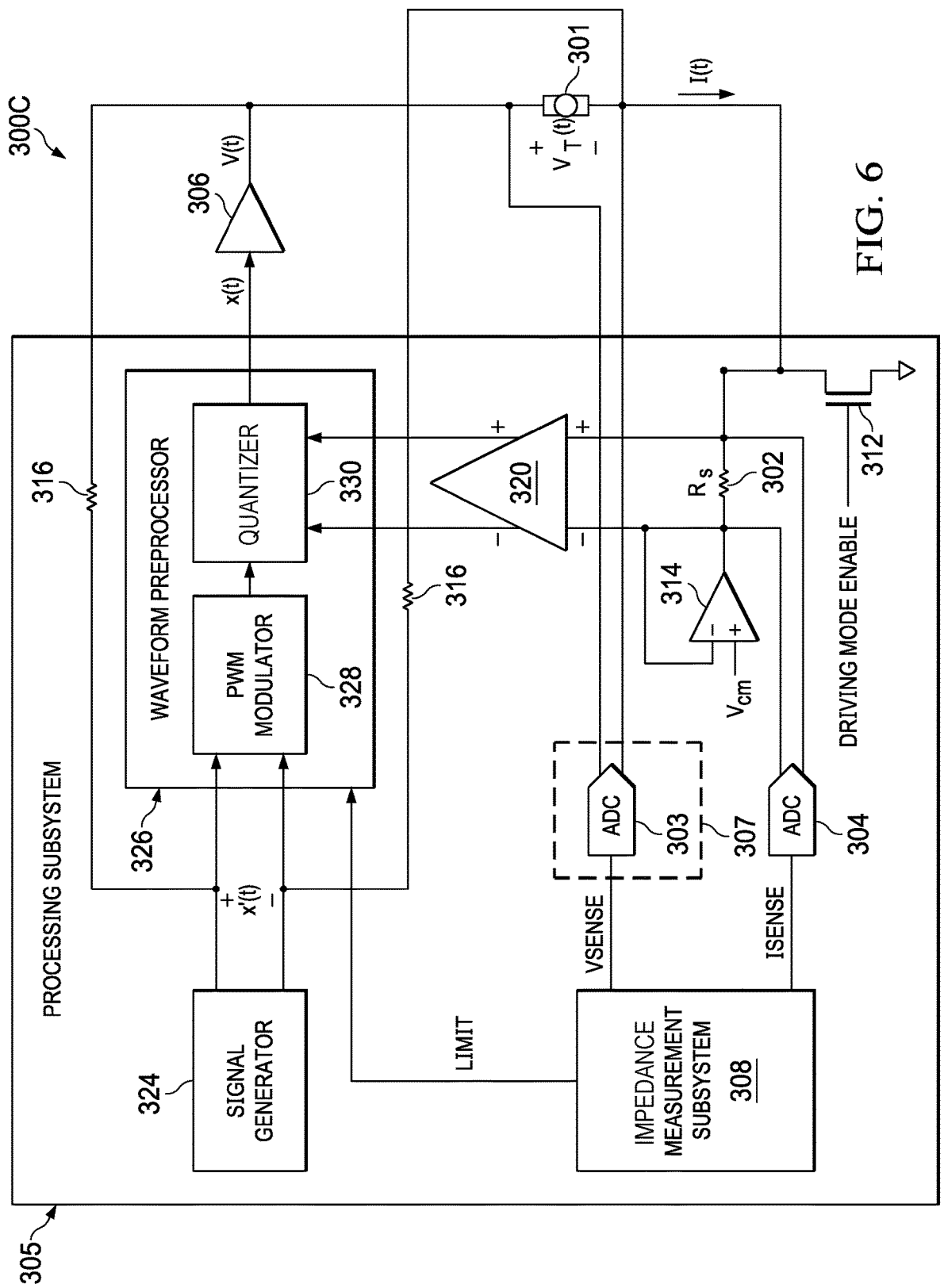
FIG. 6 illustrates selected components of yet another example host device including common-mode feedforward circuitry, in accordance with embodiments of the present disclosure.

FIG. 6 illustrates selected components of an example host device 300C including common-mode feedforward circuitry, in accordance with embodiments of the present disclosure. Host device 300C depicted in FIG. 6 may be similar in many respects to host device 300 depicted in FIG. 3. Accordingly, only differences between host device 300 and host device 300C may be described below. As shown in FIG. 6, such common-mode feedforward circuitry may include a feedforward buffer 320 configured to buffer the sensed voltage across sense resistor 302 and add such buffered sense voltage to the signal path of the driving signal within quantizer 330.

Figure 7:
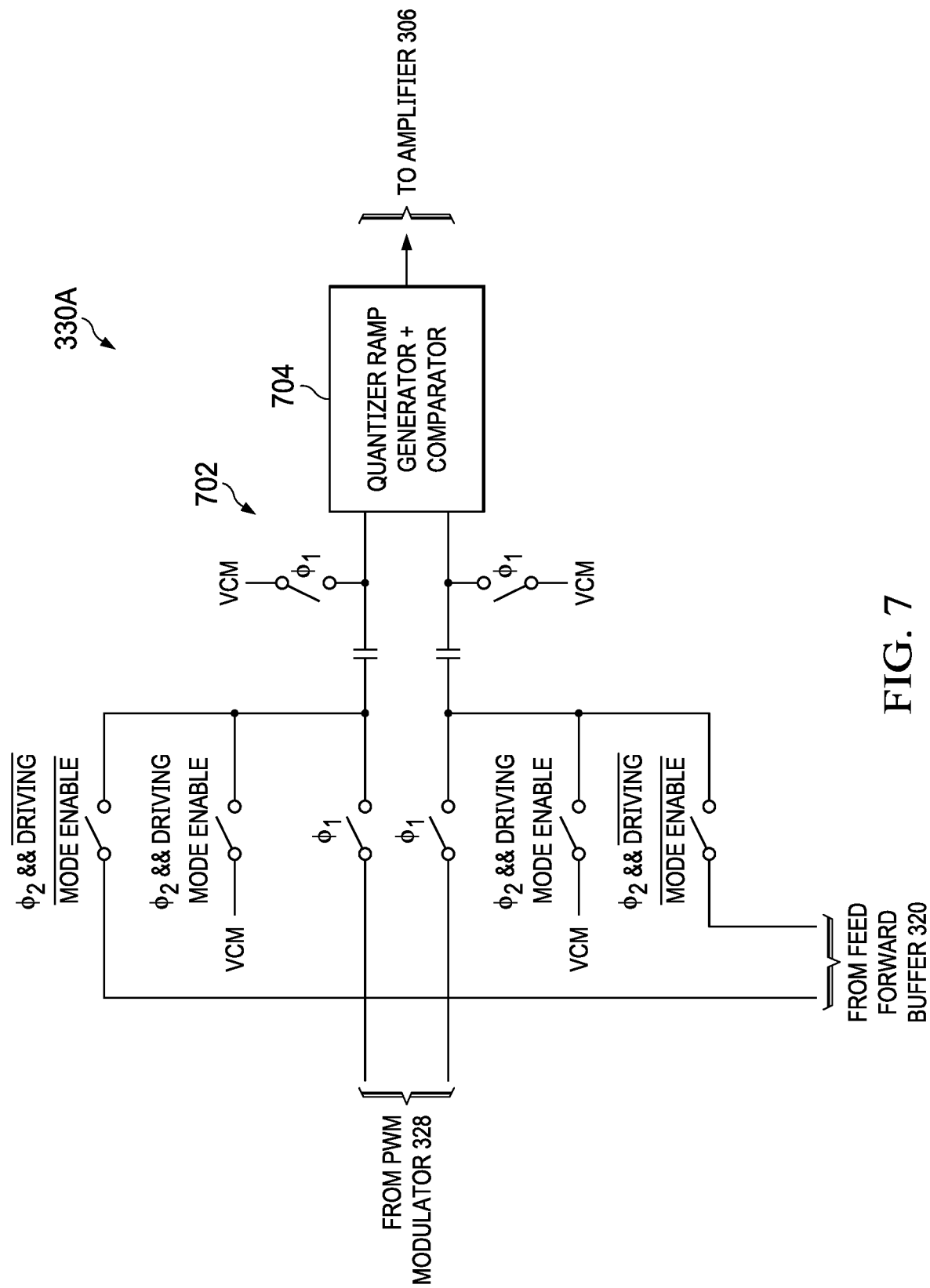
FIG. 7 illustrates selected components of an example quantizer, in accordance with embodiments of the present disclosure.

For example, FIG. 7 shows selected components of an example quantizer 330A, in accordance with embodiments of the present disclosure. Quantizer 330A of FIG. 7 is an example of a quantizer that may be used to implement quantizer 330 of FIG. 6. As shown in FIG. 7, quantizer 330A may include a sampler 702 and a quantizer ramp generator/comparator 704. Further as shown in FIG. 7, in the load sensing mode and during a transfer phase (e.g., $\varphi_2$) of sampler 702, the buffered sensed voltage across sense resistor 302 may be sampled onto sampling capacitors of sampler 702. As a result, in all practical respects, the architecture shown in FIG. 6 may be functionally equivalent to that of the architectures of FIGS. 4 and 5 and may achieve the same advantages.

Although FIGS. 4-6 and their associated descriptions contemplate the use of common-mode feedforward circuitry in the presence of common-mode buffering circuitry comprising common-mode buffer 314 and ground-return transistor 312, the common-mode feedforward circuitry described above may also be useful in systems without a separate common-mode voltage buffer for use in a load sensing mode.

Figure 8:
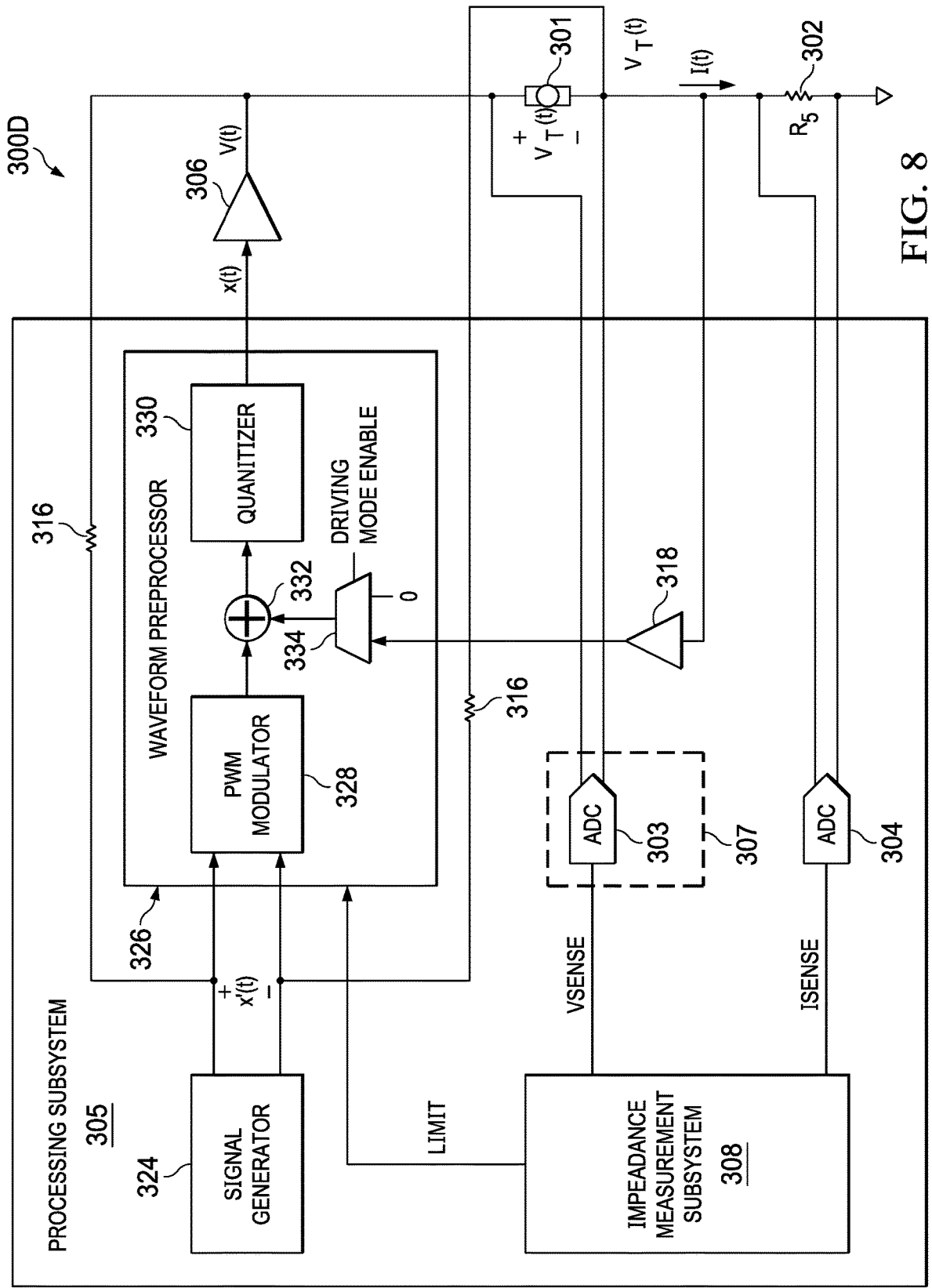
FIG. 8 illustrates selected components of an example host device including common-mode feedforward circuitry without a separate common-mode voltage buffer for use in a load sensing mode, in accordance with embodiments of the present disclosure.

To that end, FIG. 8 illustrates selected components of an example host device 300D including common-mode feedforward circuitry without a separate common-mode voltage buffer for use in a load sensing mode, in accordance with embodiments of the present disclosure. Host device 300D depicted in FIG. 8 may be similar in many respects to host device 300A depicted in FIG. 4. Accordingly, only differences between host device 300A and host device 300D may be described below.

For example, host device 300D may not include common-mode buffering circuitry comprising common-mode buffer 314 and ground-return transistor 312 present in host device 300A, and sense resistor 302 may be coupled between electromagnetic load 301 and ground. However, similar to that of host device 300A, feedforward buffer 318 of host device 300D may buffer the voltage $V_T^-(t)$ present on the "bottom" terminal of electromagnetic load 301 and multiplexer 334 may pass such buffered voltage to combiner 332, where combiner 332 may combine the buffered voltage with the output of PWM modulator 328 and pass such combined signal to quantizer 330. Feeding the buffered signal forward to the output of PWM modulator 328 may avoid latency introduced by integrators internal to PWM modulator 328. In the driving mode, multiplexer 334 may effectively pass a zero signal to combiner 332, thus essentially bypassing the feedforward circuit path.

Similar modifications to those made between host device 300A of FIG. 4 and host device 300D of FIG. 8 may also be made to host device 300B of FIG. 5 and result in an architecture functionally equivalent to host device 300D. In addition, similar modifications to those made between host device 300A of FIG. 4 and host device 300D of FIG. 8 may also be made to host device 300C of FIG. 6 and result in an architecture functionally equivalent to host device 300D.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An amplifier system comprising:
    a first feedback loop coupled between an output of an amplifier to an input of a modulator for regulating an output voltage driven at the output of the amplifier to a first terminal of a load of the amplifier system;
    a sense resistor for sensing a physical quantity associated with the amplifier;
    a second control loop coupled to the sense resistor such that the sense resistor is outside of the second control loop, the second control loop configured to regulate a common-mode voltage at a second terminal of the load; and
    a common-mode feedforward circuit coupled to the sense resistor and configured to minimize effects of a signal-dependent common-mode feedback of the sense resistor.

2. The amplifier system of claim 1, wherein the common-mode feedforward circuit feeds forward a voltage at a terminal of the sense resistor to combine the voltage with a modulator output voltage at an output of the modulator.

3. The amplifier system of claim 2, wherein the amplifier is configured to control the output of the amplifier and the common-mode feedforward circuit is configured to control an output of the common-mode feedforward circuit to ramp their respective voltages at a substantially similar rate.

4. The amplifier system of claim 1, wherein the second control loop is configured to be selectively enabled.

5. The amplifier system of claim 1, wherein the common-mode feedforward circuit comprises a buffer amplifier coupled at its input to a terminal of the sense resistor and coupled at its output to one of the output of the modulator or the input of a quantizer of the amplifier.

6. The amplifier system of claim 1, wherein the amplifier system is further configured to operate in a plurality of modes including:
   a driving mode in which the amplifier system generates a human-perceptible driving signal to a load of the amplifier system; and
   a load sensing mode of the amplifier system for sensing a physical quantity associated with the load in which the amplifier system generates a pilot signal to the load and the physical quantity is based on a measured characteristic of the load in response to the pilot signal.

7. The amplifier system of claim 6, wherein the second control loop is enabled during the load sensing mode and disabled during the driving mode.

8. A method comprising:
   regulating, with a first feedback loop coupled between an output of an amplifier to an input of a modulator, an output voltage driven at the output of the amplifier to a first terminal of a load at the output of the amplifier;
   sensing, with a sense resistor, a physical quantity associated with the amplifier;
   regulating, with a second control loop coupled to the sense resistor such that the sense resistor is outside of the second control loop, a common-mode voltage at a second terminal of the load; and
   minimizing, with a common-mode feedforward circuit coupled to the sense resistor, effects of a signal-dependent common-mode feedback of the sense resistor.

9. The method of claim 8, further comprising feeding forward, with the common-mode feedforward circuit, a voltage at a terminal of the sense resistor to combine the voltage with a modulator output voltage at an output of the modulator.

10. The method of claim 9, further comprising controlling the output of the amplifier and controlling an output of the common-mode feedforward circuit to ramp their respective voltages at a substantially similar rate.

11. The method of claim 8, wherein the second control loop is configured to be selectively enabled.

12. The method of claim 8, wherein the common-mode feedforward circuit comprises a buffer amplifier coupled at its input to a terminal of the sense resistor and coupled at its output to one of the output of the modulator or the input of a quantizer of the amplifier.

13. The method of claim 8, further comprising operating the amplifier system in a plurality of modes including:
   a driving mode in which the amplifier generates a human-perceptible driving signal to a load of the amplifier; and
   a load sensing mode of the amplifier for sensing a physical quantity associated with the load in which the amplifier generates a pilot signal to the load and the physical quantity is based on a measured characteristic of the load in response to the pilot signal.

14. The method of claim 13, further comprising enabling the second control loop during the load sensing mode and disabling the second control loop during the driving mode.

15. A host device, comprising:
   a load; and
   an amplifier system configured to drive the load and comprising:
      a first feedback loop coupled between an output of an amplifier to an input of a modulator for regulating an output voltage driven at the output of the amplifier to a first terminal of a load of the amplifier system;
      a sense resistor for sensing a physical quantity associated with the amplifier;
      a second control loop coupled to the sense resistor such that the sense resistor is outside of the second control loop, the second control loop configured to regulate a common-mode voltage at a second terminal of the load; and
      a common-mode feedforward circuit coupled to the sense resistor and configured to minimize effects of a signal-dependent common-mode feedback of the sense resistor.

16. The host device of claim 15, wherein the common-mode feedforward circuit feeds forward a voltage at a terminal of the sense resistor to combine the voltage with a modulator output voltage at an output of the modulator.

17. The host device of claim 16, wherein the amplifier is configured to control the output of the amplifier and the common-mode feedforward circuit is configured to control an output of the common-mode feedforward circuit to ramp their respective voltages at a substantially similar rate.

18. The host device of claim 15, wherein the second control loop is configured to be selectively enabled.

19. The host device of claim 15, wherein the common-mode feedforward circuit comprises a buffer amplifier coupled at its input to a terminal of the sense resistor and coupled at its output to one of the output of the modulator or the input of a quantizer of the amplifier.

20. The host device of claim 15, wherein the amplifier system is further configured to operate in a plurality of modes including:
   a driving mode in which the amplifier system generates a human-perceptible driving signal to a load of the amplifier system; and
   a load sensing mode of the amplifier system for sensing a physical quantity associated with the load in which the amplifier system generates a pilot signal to the load and the physical quantity is based on a measured characteristic of the load in response to the pilot signal.

21. The host device of claim 20, wherein the second control loop is enabled during the load sensing mode and disabled during the driving mode.

* * * * *